(12) United States Patent
Maegawa et al.

(10) Patent No.: US 9,553,221 B2
(45) Date of Patent: Jan. 24, 2017

(54) ELECTROMAGNETIC CASTING METHOD AND APPARATUS FOR POLYCRYSTALLINE SILICON

(71) Applicant: SUMCO CORPORATION, Tokyo (JP)

(72) Inventors: Koichi Maegawa, Tokyo (JP);
Tomohiro Onizuka, Tokyo (JP);
Mitsuo Yoshihara, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 546 days.

(21) Appl. No.: 13/845,507

(22) Filed: Mar. 18, 2013

(65) Prior Publication Data
US 2013/0255315 A1   Oct. 3, 2013

(30) Foreign Application Priority Data
Feb. 14, 2011   (JP) ................. 2011-029115

(51) Int. Cl.

| | |
|---|---|
| H01L 31/028 | (2006.01) |
| C30B 29/06 | (2006.01) |
| C30B 13/20 | (2006.01) |
| C30B 15/08 | (2006.01) |
| C30B 28/06 | (2006.01) |
| B22D 11/00 | (2006.01) |
| B22D 11/041 | (2006.01) |
| B22D 11/108 | (2006.01) |
| B22D 11/11 | (2006.01) |

(Continued)

(52) U.S. Cl.
CPC ........... *H01L 31/028* (2013.01); *B22D 11/001* (2013.01); *B22D 11/041* (2013.01); *B22D 11/108* (2013.01); *B22D 11/11* (2013.01); *B22D 11/1213* (2013.01); *B22D 11/20* (2013.01); *C30B 13/20* (2013.01); *C30B 15/08* (2013.01); *C30B 28/06* (2013.01); *C30B 29/06* (2013.01); *C30B 28/04* (2013.01)

(58) Field of Classification Search
None
See application file for complete search history.

(56) References Cited

U.S. PATENT DOCUMENTS

| 5,919,302 A * | 7/1999 | Falster et al. ..................... 117/3 |
| 7,749,324 B2 * | 7/2010 | Yoshihara et al. .............. 117/18 |

(Continued)

FOREIGN PATENT DOCUMENTS

| EP | 0763610 A2 * | 3/1997 |
| JP | 2001-19593 | 1/2001 |
| WO | WO 0022201 A1 * | 4/2000 |

*Primary Examiner* — Michael Kornakov
*Assistant Examiner* — Hua Qi
(74) *Attorney, Agent, or Firm* — Clark & Brody (57) ABSTRACT

Disclosed is an electromagnetic casting method of polycrystalline silicon which is characterized in that polycrystalline silicon is continuously cast by charging silicon raw materials into a bottomless cold mold, melting the silicon raw materials using electromagnetic induction heating, and pulling down the molten silicon to solidify it, wherein the depth of solid-liquid interface before the start of the final solidification process is decreased by reducing a pull down rate of ingot in a final phase of steady-state casting. By adopting the method, the region of precipitation of foreign substances in the finally solidified portion of ingot can be reduced and cracking generation can be prevented upon production of a polycrystalline silicon as a substrate material for a solar cell.

3 Claims, 5 Drawing Sheets

(51) Int. Cl.
*B22D 11/12* (2006.01)
*B22D 11/20* (2006.01)
*C30B 28/04* (2006.01)

(56) References Cited

U.S. PATENT DOCUMENTS

2006/0005761 A1* 1/2006 Kulkarni et al. ............... 117/15
2008/0210156 A1* 9/2008 Sasatani et al. ................ 117/81
2009/0044926 A1* 2/2009 Kida et al. .................... 164/507

* cited by examiner

ELECTROMAGNETIC CASTING METHOD AND APPARATUS FOR POLYCRYSTALLINE SILICON

BACKGROUND OF THE INVENTION

1. Field of the Invention

The present invention relates to an electromagnetic casting method and apparatus for continuously producing a polycrystalline silicon ingot by applying a casting technique through electromagnetic induction, particularly, an electromagnetic casting method of silicon capable of preventing a crack generation by reducing the region of precipitation of foreign substances in a finally solidified portion of the silicon ingot upon production of a polycrystalline silicon to be used as a substrate material of a solar cell, and an electromagnetic casting apparatus suitable for conducting the same.

2. Description of the Related Art

When an electromagnetic casting apparatus, to which a bottomless cold mold divided in a circumferential direction is attached, is used, since a molten substance (molten silicon in this case) and the mold are almost non-contact with each other, a silicon ingot free of impurity contamination can be continuously produced. Further, a significant reduction of production cost can be achieved owing to an advantage that no high purity material is required as a material of the mold due to less contamination from the mold and also of a continuous casting capability. Therefore, the electromagnetic casting apparatus has conventionally been applied for production of polycrystalline silicon to be used as a substrate material of a solar cell.

Moreover, in recent years, a melting method using a plasma arc heating as an auxiliary melting heat source in combination has been conducted to melt silicon raw materials charged into the mold.

Figure 6:
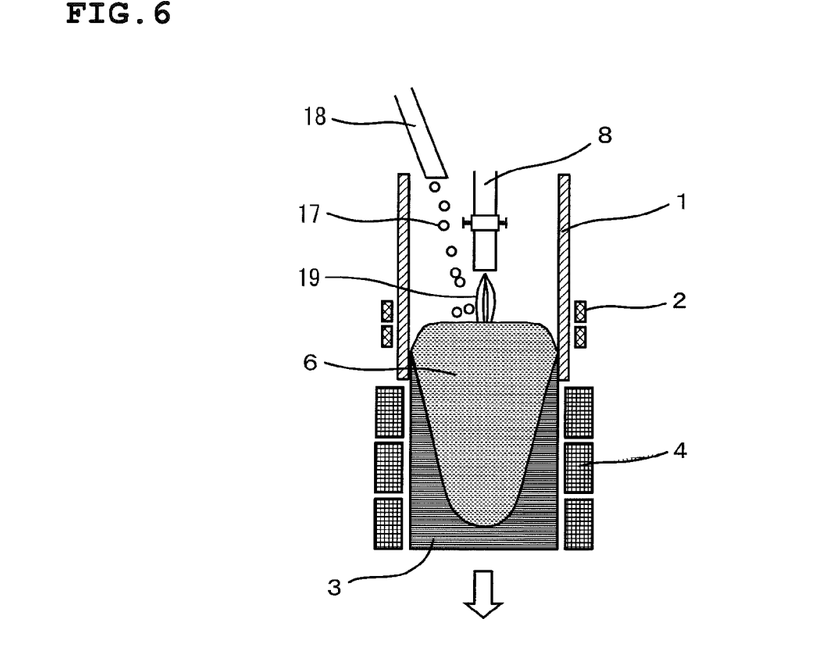
FIG. 6 is a view schematically showing a configuration example of a principal part of an electromagnetic casting apparatus to be used for producing polycrystalline silicon.

FIG. 6 is a view schematically showing a configuration example of a principal part of an electromagnetic casting apparatus to be used for producing polycrystalline silicon. As shown in FIG. 6, strip-shaped elements elongated in a vertical direction, the element having an interior to be cooled with water, are arranged inside an induction heating coil 2 in a mutually-insulated state in the induction coil 2, in parallel to the winding axis direction of the induction coil 2, and a space surrounded by these strip-shaped element forms a mold (that is, a bottomless cold mold of which side wall portion is cooled with water) 1. Typically, a water cooling copper mold in which the strip-shaped element is made of copper is used as the cold mold 1.

Below the induction heating coil 2, a heat retention heater 4 for heating a solidified silicon ingot 3 to prevent an abrupt cooling is installed. Moreover, above the cold mold 1, a material supply nozzle 18 for charging silicon raw materials 17 into the mold 1 during its melting process and a plasma torch 8 configured to be vertically movable are also attached.

In order to produce a polycrystalline silicon ingot using the above-described electromagnetic casting apparatus, an alternating current is applied to the induction coil 2, and the plasma torch 8 is lowered and turned on (to be a state capable of being energized). Subsequently, with a state where a support stand (not shown) is provided at a position corresponding to the bottom portion of the cold mold 1, the silicon raw materials are charged into the mold 1 and molten by generating a plasma arc 19 between an electrode of the plasma torch 8 and the charged silicon raw materials. Since each of strip-shaped elements forming the mold 1 is electrically separated from others, a current flowing in each element forms a loop, with which a current flowing along the inner wall side of the mold 1 create a magnetic field in the mold 1, and thereby, the silicon raw materials charged into the mold can be heated and molten by plasma arc heating and induction heating. The silicon raw materials (molten silicon 6) in the mold 1 are molten without contacting the mold 1 by receiving inward force in the direction normal to the side surface of the molten silicon 6, which is generated through the interaction of a current flowing along the surface of the molten silicon 6 and a magnetic field created by a current flowing along the mold inner wall.

When the support stand is gradually moved downward after the molten silicon 6 is sufficiently homogenized, the cooling of the molten silicon 6 starts from a portion far away from an induction coil 2, and the silicon ingot 3 having the same sectional shape as that of the mold is formed. By supplying the silicon raw materials 17 from the material supply nozzle 18 in an amount corresponding to an amount of a downward movement of the support stand so as to constantly maintain the upper surface of the molten silicon 6 at the same height level and to continue heating, melting, withdrawing, and supplying the raw materials, the polycrystalline silicon ingot can be produced continuously.

It is noted that, in an electromagnetic casting method using the above-described electromagnetic casting apparatus, after the startup of casting the ingot, charging the silicon raw materials as well as induction heating and plasma arc heating of the charged materials are stopped to thereby complete the casting of the ingot, at the time that the length of the ingot reaches approximately 7 m because of constraints of facility. To be strict, such operation cannot be said as a continuous casting, however since the operation is conducted continuously from start to end of the casting, this method is also referred to as a continuous casting method (an apparatus used in this method is referred to as a continuous casting apparatus) in comparison with a conventional batch-type casting method in which molten silicon is solidified in a crucible or mold.

After completion of casting, a pull down operation of the support stand is stopped, and then a final solidification of liquid molten silicon in the mold is performed. In this operation, if the liquid molten silicon should be left in as-is condition, solidification should start from the upper surface of the molten silicon in the mold, the molten silicon confined therein should be solidified in the final phase, and thus cracking is liable to occur in the finally solidified portion of the ingot due to a volume expansion associated with the final solidification. For this reason, in the final solidification process, a carbon block is suspended as an induction incurring member above the molten silicon so that heat by induction heating can be input from above the molten silicon to allow it to be solidified from below.

Figure 7:
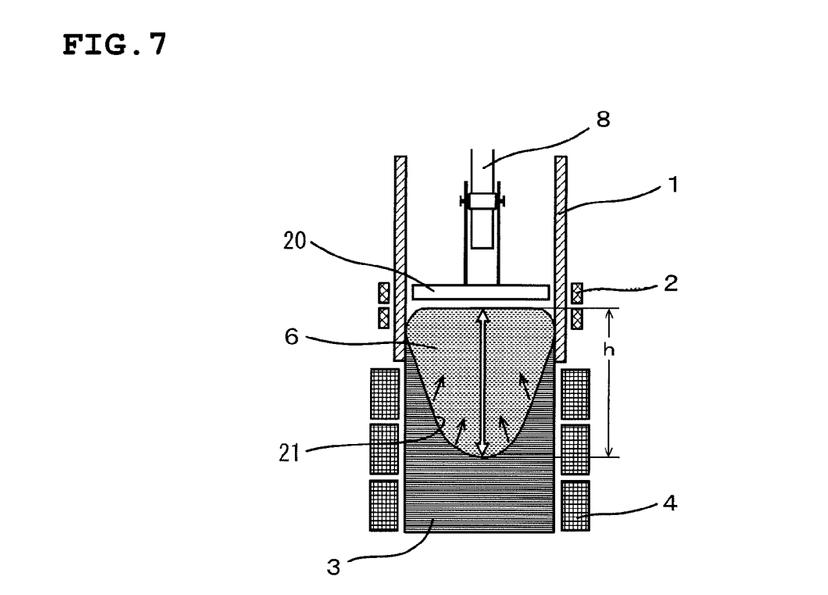
FIG. 7 is a view for describing a final solidification process in a production of polycrystalline silicon by electromagnetic induction.

FIG. 7 is a view describing a final solidification process in the production of polycrystalline silicon by electromagnetic induction. As shown in FIG. 7, immediately after charging of silicon raw materials as well as induction heating and plasma arc heating of the charged materials are stopped to complete the casting operation, an unsolidified molten silicon 6 remains above the upper portion of a solidified silicon ingot 3 (within a mold and in the vicinity thereof). A carbon block 20 is suspended above the molten silicon 6, an electric current is applied to the induction coil 2 to heat the carbon block 20 by electromagnetic induction. With this, since the molten silicon 6 is kept warm from upward, the solidification progresses from the lower portion of the molten silicon 6, in other words, upward from a solid-liquid interface 21 (indicated by an arrow in FIG. 7), and thus the upper surface of the molten silicon 6 is solidified in the final phase. It is noted that a distance h indicated by an out-lined arrow is the depth of solid-liquid interface in FIG. 7.

However, in this final solidification process, the following two problems occasionally arise.

One problem is that after the plasma arc heating is stopped, the precipitation of foreign substances is caused by an abrupt temperature drop before starting to warm the molten silicon by the carbon block.

Figure 8:
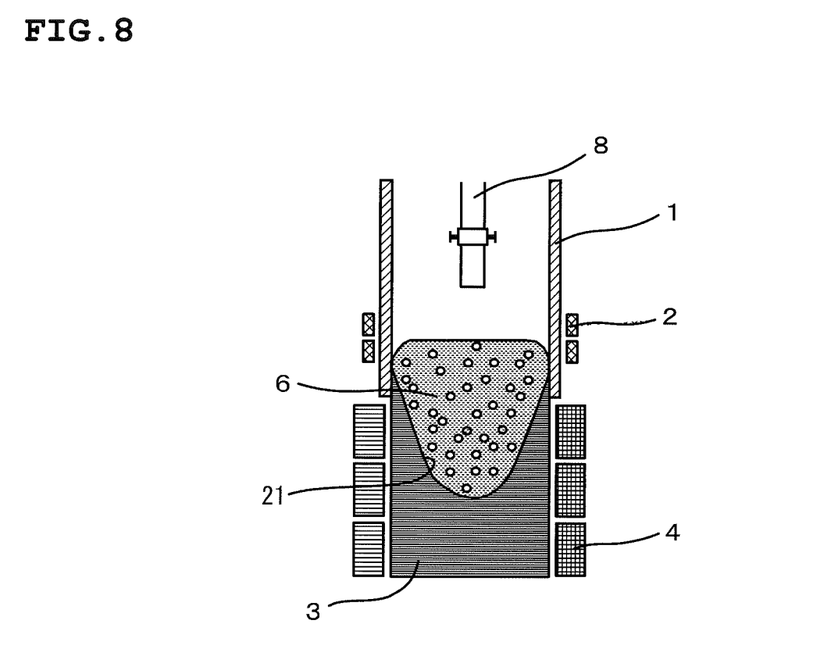
FIG. 8 is a view conceptually showing a precipitation state of foreign substances in a final solidification process.

FIG. 8 is a view conceptually showing a precipitation state of foreign substances in a final solidification process, representing a longitudinal cross section of the finally solidified portion of the silicon ingot 3, including a mold center axis. As shown in FIG. 8, the precipitation region of foreign substances extends entirely inside the solid-liquid interface 21 (that is, in the unsolidified molten silicon 6). Foreign substances mean impurities such as SiC, SiN, SiO, and C (carbon). These impurities cause a leak current failure called a shunt when a solar cell was made using a wafer cut from a silicon ingot including these impurities as a substrate.

The other problem, which may be caused in the final solidification process, is that the ingot is broken by a solidification expansion when the surface only is solidified earlier while the molten silicon is confined inside the solidified portion.

Figure 9A:
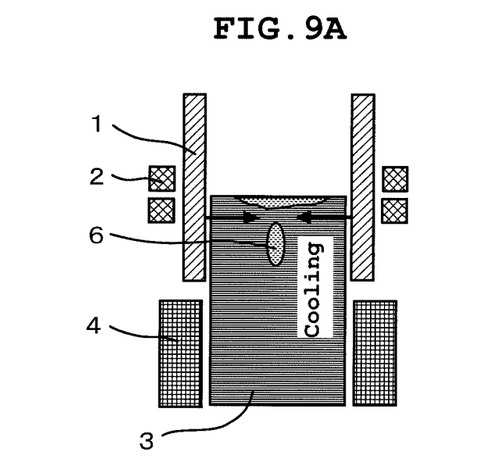
FIGS. 9A and 9B are views conceptually illustrating, a state of cracking in an ingot caused by the confinement of molten silicon into the finally solidified portion of ingot.
Figure 9B:
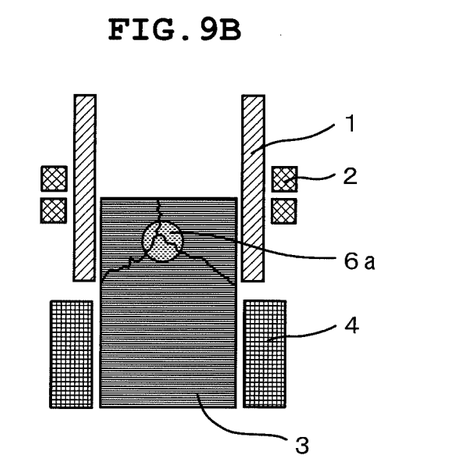

FIGS. 9A and 9B are views conceptually illustrating, a situation of cracking in an ingot caused by the confinement of molten silicon inside the ingot. As shown in FIG. 9A, in a case such that the cooling from the mold side wall is particularly intensive (indicated by arrows in FIG. 9), even if warming is performed using a carbon block, the warming effect does not reach deep into the melt pool, and the molten silicon 6 may be confined within the solidified portion. In this case, as shown in FIG. 9B, the confined molten silicon solidifies (solidified silicon 6a) and expands to cause cracking in the finally solidified portion of the ingot 3, and thus a workload to take out the ingot 3 is increased. The confinement of the molten silicon 6 occurs more likely as the depth of solid-liquid interface 21 (see FIG. 7 above) is increased at the time that the final solidification process starts.

No cases of preventive measures have been reported so far with respect to such the precipitation of foreign substances or cracking in a finally solidified portion of silicon ingot. For example, Japanese Patent Application Publication (JP-A) No. 2001-19593 discloses a continuous casting method of silicon in which electromagnetic induction heating and plasma heating with plasma arc are used in combination, so that qualities of the silicon to be used as a solar cell are improved. According to a casting method described in JP-A No. 2001-19593, a load of electromagnetic induction heating can be reduced by using a plasma heating in combination for melting raw materials in the middle of the casting process, and a solid-liquid interface is flattened by suppressing a thermal convection of molten silicon owing to an electromagnetic force so as to reduce a downward thermal flow rate. As a result, a temperature gradient in a radial direction of a silicon ingot immediately after solidification is reduced and a thermal stress generated inside a crystal is alleviated so that the generation of crystal defects, which reduces a conversion efficiency of a solar cell, is suppressed. However, the precipitation of foreign substances in the finally solidified portion of ingot, a crystalline quality degradation caused therefrom, cracking generation, and counter measures against these problems are not described in JP-A No. 2001-19593.

SUMMARY OF THE INVENTION

An object of the present invention, which was made under the circumstances above, is to provide an electromagnetic casting method of silicon capable of preventing the generation of cracking by reducing a precipitation region of foreign substances in a finally solidified portion of ingot upon production of a polycrystalline silicon to be used as a substrate material of a solar cell through the electromagnetic casting method and an electromagnetic casting apparatus suitable for applying the same.

As mentioned above, the confinement of molten silicon is highly likely to occur as the depth of solid-liquid interface is increased upon starting a final solidification process. On the other hand, it has been found that the depth of solid-liquid interface depends on a pull down rate of ingot, in other words, there is a correlation between the depth of solid-liquid interface and a pull down rate of ingot.

Figure 2:
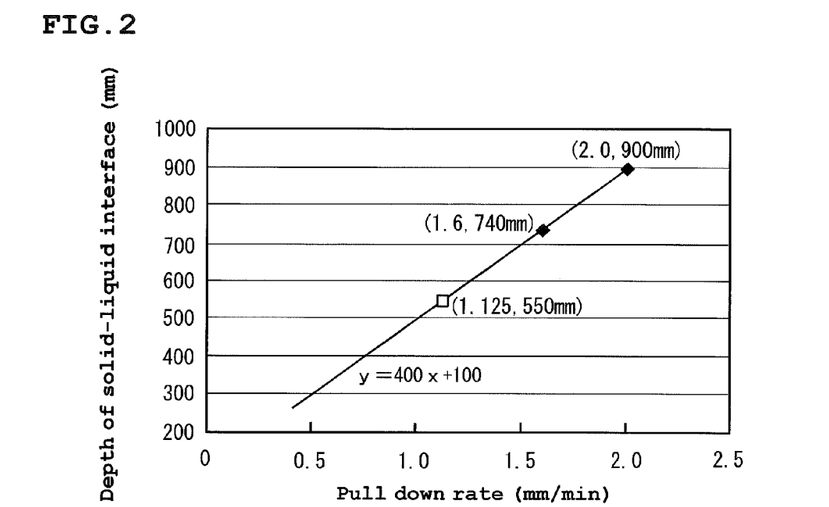
FIG. 2 is a diagram illustrating a relationship between a pull down rate of ingot and the depth of solid-liquid interface.

FIG. 2 is a view illustrating a relationship between a pull down rate of ingot and the depth of solid-liquid interface. In an electromagnetic casting apparatus used in this method, there is a correlation represented by an expression: $y=400x+100$ (mm) between the depth y of solid-liquid interface and a pull down rate x of ingot, and thus when the pull down rate x of ingot is set to 1.125 mm/min, the depth y of solid-liquid interface becomes 550 mm (indicated by □ mark in FIG. 2). When the depth of solid-liquid interface is actually measured by setting the pull down rate to 2.0 mm/min or 1.6 mm/min, the depth of solid-liquid interface becomes 900 mm or 740 mm respectively (indicated by ♦ mark in FIG. 2), showing that the measurement results correspond to the above correlation. It is noted that the depth of solid-liquid interface can be obtained, by presuming the shape of the solid-liquid interface based on growth directions of crystals in a longitudinal cross section including a mold center axis of a finally solidified portion of ingot and measuring a distance between the deepest portion of the solid-liquid interface and the upper end surface of the ingot.

Therefore, the inventors used the relationship that the depth of solid-liquid interface is proportional to a pull down rate of ingot to examine the capability of reducing the precipitation region of foreign substances and preventing the generation of cracking by applying a method for reducing the depth of solid-liquid interface in the finally solidified portion just before proceeding to the final solidification process through the reduction of the pull down rate.

As a result, it was verified that, the depth of solid-liquid interface can be reduced to avoid the confinement of molten silicon and reduce a precipitation region of foreign substances by reducing a pull down rate of ingot linearly and gently relative to the elapsed time in the final phase of casting (typically, referred to as "a steady-state casting" since the casting is performed at a steady pull down rate of ingot). Therefore, a production yield of an ingot can be improved by preventing cracking of the ingot and by confining the generation of crystal defects to be caused by the precipitation of foreign substances within a literally finally solidified portion of the ingot.

The present invention was accomplished based on such an examination, and the summaries thereof are an electromagnetic casting method of polycrystalline silicon (1) described below and an electromagnetic casting apparatus (2) described below which is suitable for applying the same.

(1) An electromagnetic casting method of polycrystalline silicon for continuously casting a polycrystalline silicon by charging silicon raw materials into a bottomless cold mold, melting the silicon raw materials using electromagnetic induction heating, and pulling down to solidify the molten silicon, wherein the depth of solid-liquid interface before the startup of final solidification process is reduced by reducing a pull down rate of ingot in the final phase of a steady-state casting.

"Final solidification process" used herein refers to a process immediately after when the casting of ingot is completed by stopping charging of silicon raw materials as well as induction heating and plasma arc heating of the charged materials until when an unsolidified molten silicon in a mold is solidified. Since the surface of molten silicon should solidify sooner, in order to prevent the generation of cracking in an ingot due to a solidification expansion of the molten silicon confined within the solidified portion, typically, the molten silicon is warmed by such a means that a carbon block is disposed in the vicinity of the upper surface of the molten silicon and heated by electromagnetic induction.

It is noted that "the depth of solid-liquid interface" refers to a distance from the surface to the deepest portion of unsolidified molten silicon in an interface between a solidified portion and an unsolidified portion of an ingot during its casting operation (see FIG. 7 above). Typically, a solid-liquid interface is symmetric with respect to the center axis of a mold and convex downwardly, the depth of which becomes deepest in the vicinity of intersection with the center axis.

In the electromagnetic casting method of polycrystalline silicon of the invention, if a pull down rate of ingot is reduced by 0.05 to 0.2 mm/min per hour, the generation of cracking can be desirably prevented effectively by reducing a precipitation region of foreign substances in a finally solidified portion of the ingot.

(2) An electromagnetic casting apparatus for polycrystalline silicon including: a conductive bottomless cold mold in which a part thereof along an axial direction is divided into a plurality of elements in a circumferential direction; an induction coil surrounding the mold; and a heat retention heater disposed below the mold for slowly cooling a solidified silicon ingot, in which silicon melted by electromagnetic induction heating using the induction coil is pulled down and solidified, the apparatus comprising: a pull down rate controller for changing a pull down rate of ingot in response to a casting stroke, the controller including a casting stroke counter for measuring a casting stroke; a motor drive amount computing unit for computing the drive amount of a shaft-pull-down motor according to the predetermined deceleration rate by inputting the measured casting stroke and outputting a computation result to the shaft-pull-down motor; and a shaft-pull-down motor that is driven based on a signal input from the motor drive amount computing unit.

In this case, "a casting stroke" means a casting distance withdrawn from a starting point of casting (that is, a distance corresponding to an instant length of ingot as being withdrawn). Specifically, it refers to a moving distance of a support stand from a starting point of casting, the support stand holding an ingot with the lower end surface of the ingot being fixed onto it.

Advantageous Effects of Invention

According to the electromagnetic casting method of polycrystalline silicon, a precipitation region of foreign substances can be limited in a finally solidified portion of ingot, and the confinement of molten silicon inside the solidified portion can be prevented. Therefore, a production yield of ingot can be improved by preventing cracking of ingot as well as by reducing a precipitation region of foreign substances and a region where crystal defects being generated that are attributed to the above. This method can be easily performed by using the electromagnetic casting apparatus for polycrystalline silicon of the invention.

BRIEF DESCRIPTION OF THE DRAWINGS

FIGS. 3A and 3B are diagrams illustrating a change of a casting stroke and a pull down rate of ingot when a deceleration pattern is changed, of these.

FIGS. 4A and 4B are views for explaining a method for measuring a precipitation region of foreign substances and evaluating the absence or presence of cracking generation in a finally solidified portion of ingot, of these, FIG. 4A shows a precipitation region of foreign substances and FIG. 4B shows a state of cracking generation.

DETAILED DESCRIPTION OF THE PREFERRED EMBODIMENTS

The electromagnetic casting method of polycrystalline silicon of the invention is based on the premise that polycrystalline silicon is continuously cast by charging silicon raw materials into a bottomless cold mold, melting the silicon raw materials by electromagnetic induction heating, and pulling down the molten silicon to solidify it.

Such an application of electromagnetic induction technique is taken as the premise because molten silicon can be cast in a mold almost without contacting the mold to continuously cast polycrystalline silicon, which is not contaminated with metal from the mold and capable of favorably maintaining a conversion efficiency upon production of polycrystalline silicon to be used as a substrate material of a solar cell. Furthermore, by using plasma arc heating in combination, a rapid and uniform melting of silicon raw materials can be promoted to further reduce a production cost and as well contribute to an improvement in quality to be used for a solar cell.

The electromagnetic casting method of polycrystalline silicon of the invention is characterized in that the depth of solid-liquid interface before the startup of the final solidification process is reduced by reducing a pull down rate of ingot in a final phase of steady-state casting.

Conventionally, a pull down rate of ingot after the start of casting was in a steady-state, and after reaching a predetermined casting stroke (e.g., approximately 7 m in ingot length), the casting was completed by promptly reducing the pull down rate to zero (0 mm/min), and then shifted to the final solidification process.

On the other hand, in the electromagnetic casting method of the invention, a process for reducing a pull down rate of ingot is arranged in a final phase of steady-state casting (this process is referred to as "a deceleration process" or "a melt cutback process"), and after the depth of solid-liquid interface is decreased to an expected level by using a proportional relationship between the depth of solid-liquid interface and the pull down rate (see FIG. 2 above), the casting operation is shifted to the final solidification process. It is noted that, the final solidification process is a process after the casting operation is completed, and in this process, charging of raw materials, induction heating and plasma arc heating of the charged materials are all stopped, whereas in the deceleration process (melt cutback process), a casting operation is performed, and thus charging of raw materials, plasma arc heating of the charged materials and the like are still continued.

A pull down rate of ingot is reduced in a final phase of steady-state casting. With this, time duration of steady-state casting operation is extended, and whereby high production efficiency can be maintained. It is desirable that the pull down rate is reduced at a timing such that the pull down rate becomes just zero (0 mm/min) (pull down is stopped) at the time that a predetermined casting stroke is achieved, and immediately after this, the casting operation is shifted to the final solidification process.

The mode (pattern) of reducing a pull down rate of ingot is not particularly limited. For example, either of a stepwise deceleration or a continuous deceleration can be adopted. However, from a viewpoint of making possible efforts for expelling disturbances to the environment where the solidification (in other words, a crystal growth) is performed, it is desirable to reduce the pull down rate linearly with respect to the elapsed time.

Figure 3A:
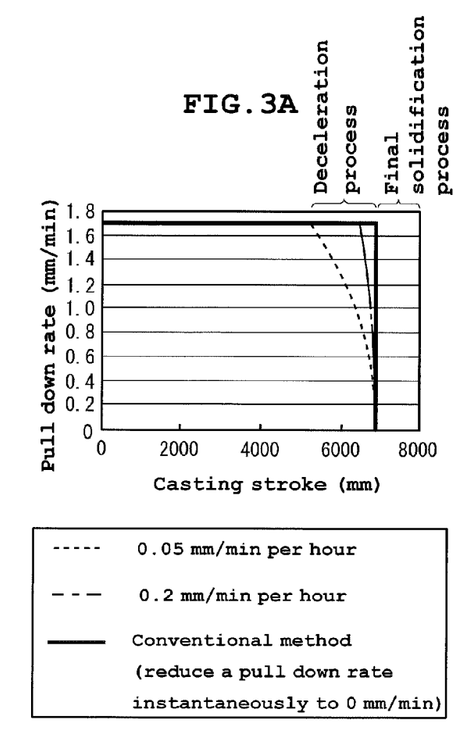
FIG. 3A shows a relationship between a pull down rate and a casting stroke.
Figure 3B:
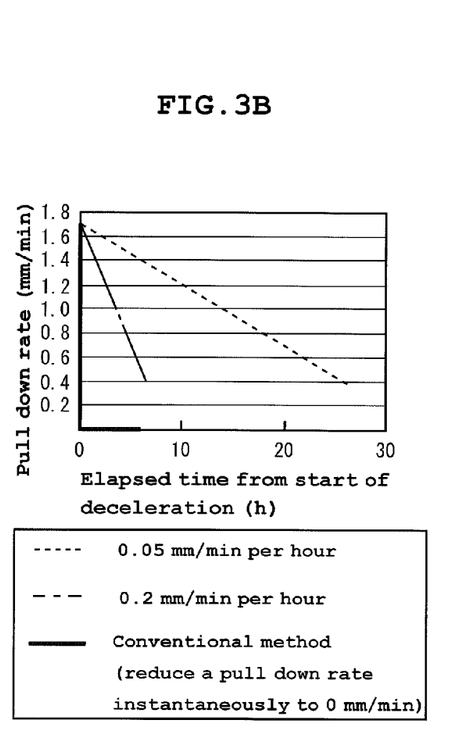
FIG. 3B shows a relationship between elapsed time from the startup of deceleration and a pull down rate.

FIGS. 3A and 3B are diagrams illustrating changes of a casting stroke and a pull down rate of ingot when a deceleration pattern is changed, of these FIG. 3A shows a relationship between a pull down rate and a casting stroke, and FIG. 3B shows a relationship between elapsed time from the start of deceleration and a pull down rate. As an example, the phrase "0.05 mm/min per hour" described in FIGS. 3A and 3B means that a pull down rate is reduced linearly at an hourly rate of 0.05 mm/min (0.5 mm/min for ten hours). The degree of the reduction of pull down rate is also referred to as "deceleration rate".

As shown in FIG. 3A, a pull down rate of ingot is 1.7 mm/min at steady-state casting. In a conventional casting method, no deceleration process is arranged, and a pull down rate is immediately reduced to 0 mm/min and shifted to the final solidification process at a time when a predetermined casting stroke (e.g., an ingot length of approximately 7 m) is achieved. Contrary to this, in a casting process of the invention, a deceleration process is set just before shifting to the final solidification process. In FIG. 3A, a broken line indicated as 0.05 mm/min per hour corresponds to a portion that the deceleration rate is set to 0.05 mm/min per hour.

Temporal change of pull down rate in such a deceleration processes is shown in FIG. 3B. It is seen that a pull down rate is reduced linearly with respect to elapsed time when a deceleration rate is set to 0.2 mm/min per hour or 0.05 mm/min per hour. In a conventional casting method, since no deceleration process is adopted, a pull down rate of ingot is reduced instantaneously from 1.7 mm/min to zero (0 mm/min) Moreover, for example, when the deceleration rate is set to 0.05 mm/min per hour, it is confirmed that it will take 26 hours to reduce a pull down rate of ingot from 1.7 mm/min of steady-state casting to 0.4 mm/min.

In an electromagnetic casting method of the invention, if the deceleration of the pull down rate of the ingot is set in the range of 0.05 to 0.2 mm/min per hour, as shown in an example below, the region of precipitation of foreign substances in the finally solidified portion of ingot can be reduced and generation of cracking can be effectively prevented.

The reduction of pull down rate is set to 0.05 mm/min per hour or higher because a production efficiency (efficiency of manufacturing ingot) can be maintained in an allowable range. As apparent from FIG. 2 described above, the depth of solid-liquid interface decreases as a pull down rate of ingot is reduced, whereby the rising of solid-liquid interface in association with the solidification of silicon from below becomes easy to be completed before the solidification of the upper surface of molten silicon, thereby making the confinement of molten silicon less likely to occur. Moreover, since foreign substances are concentrated on the side of the molten silicon in a process of solidification, as the depth of solid-liquid interface decreases, the depth of the region of precipitation of foreign substances is also reduced, whereby the region is reduced. However, as shown in FIG. 3B, as the deceleration rate is smaller, a longer duration of time is required to reduce a pull down rate, and thus when the deceleration rate is less than 0.05 mm/min per hour, the deceleration process requires so much time that the production efficiency of silicon ingot is markedly lowered.

On the other hand, the reduction of pull down rate is set to not more than 0.2 mm/min per hour in order to ensure an effect for reducing the region of precipitation of foreign substances as well as an effect for preventing cracking generation in the finally solidified portion of ingot. As apparent from FIG. 2 described above, the depth of solid-liquid interface increases as a pull down rate of ingot is increased, when the deceleration rate exceeds 0.2 mm/min per hour, the effect of the invention cannot be fully expected because of a shortened deceleration process.

As described above, according to the electromagnetic casting method of the invention, by arranging a deceleration process (a melt cutback process) before shifting to the final solidification process, the depth of solid-liquid interface is decreased so as to reduce the region of precipitation of foreign substances in the finally solidified portion of ingot, and whereby cracking generation can be prevented.

As mentioned above, the electromagnetic casting apparatus for polycrystalline silicon of the invention includes a conductive bottomless cold mold, an induction coil, and a heat retention heater for slowly cooling a solidified silicon ingot, in which molten silicon that is melted by electromagnetic induction heating using the induction coil is pulled down and solidified, and is characterized in that the apparatus comprises a pull down rate controller for changing a pull down rate of ingot in response to a casting stroke, wherein the pull down rate controller comprises: a casting stroke counter for measuring a casting stroke; a motor drive amount computing unit for computing the drive amount (the number of revolutions) of a shaft-pull-down motor according to a predetermined deceleration rate by inputting the measured casting stroke and then outputting a computation result to the shaft-pull-down motor; and a shaft-pull-down motor that is driven based on a signal input from the motor drive amount computing unit.

Figure 1:
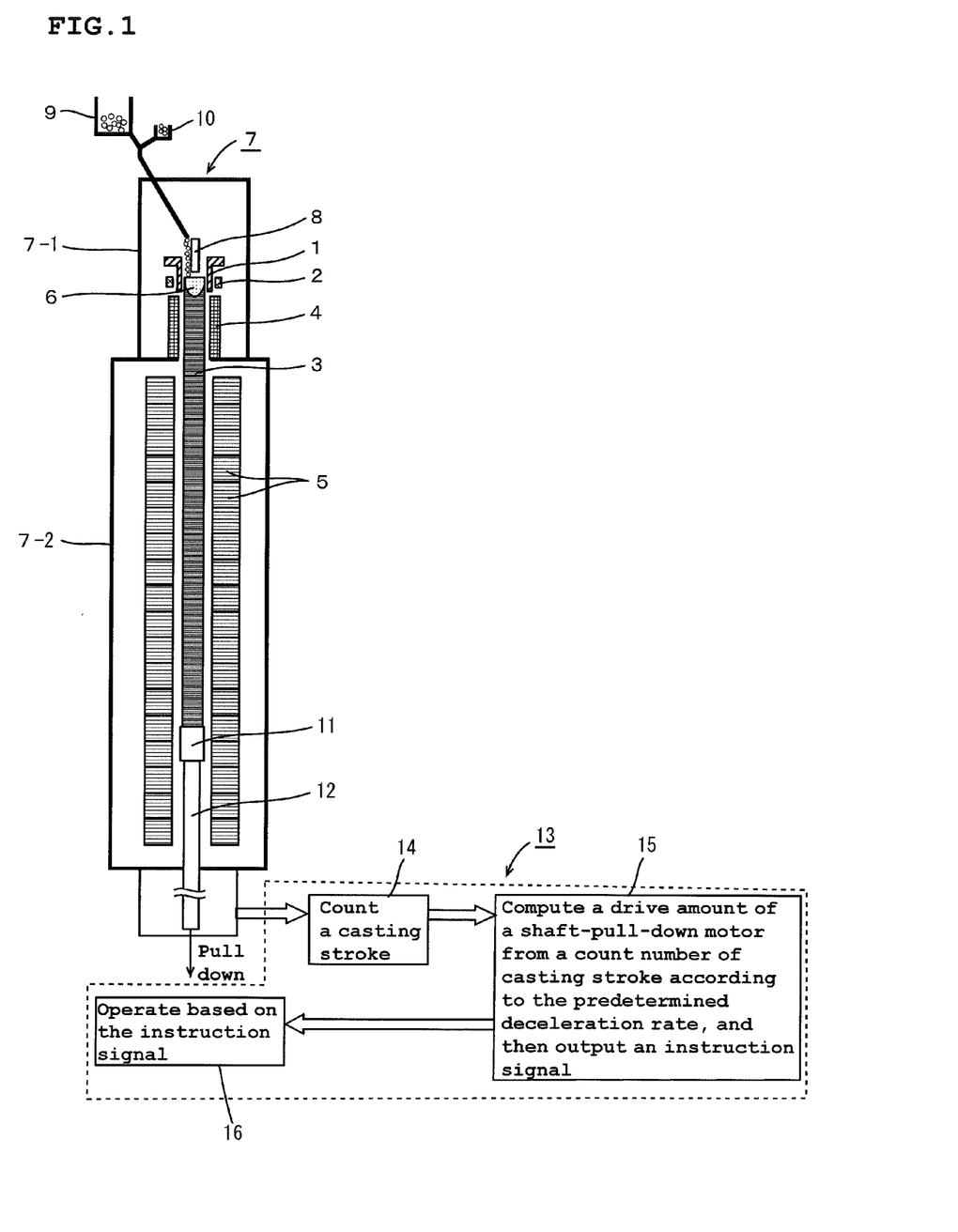
FIG. 1 is a vertical sectional view showing a schematic configuration example of an electromagnetic casting apparatus for polycrystalline silicon of the invention.

FIG. 1 is a vertical sectional view showing a schematic configuration example of the electromagnetic casting apparatus for polycrystalline silicon of the invention. Similarly to an ordinarily used electromagnetic casting apparatus, the electromagnetic casting apparatus of the invention comprises a conductive bottomless cold mold 1 and an induction coil 2 surrounding the same. Below the induction heating coil 2, a heat retention heater 4 for heating a solidified silicon ingot 3 to prevent its abrupt cooling is installed, and below the heat retention heater 4, soaking heaters 5 are arranged in multiple stages.

These devices are installed in a sealed chamber 7 so that molten silicon 6 and a high-temperature silicon ingot 3 are not brought into direct contact with the atmosphere. The sealed chamber 7, as shown in FIG. 1, comprises a main chamber 7-1 and a sub-chamber 7-2 connected to the main chamber 7-1, and normally, an interior of the chamber 7 is substituted with an inert gas so as to perform a continuous casting in a slightly pressurized state.

Above the chamber 7, a raw material tank 9 and a dopant tank 10 for storing raw materials or the like to be charged into the mold 1 are disposed. A support stand 11 for holding an ingot with its lower end surface secured is disposed fixedly to a vertically movable shaft 12. Further, in this exemplary apparatus, a plasma torch 8 for heating silicon raw materials as necessary is attached above the mold 1.

The electromagnetic casting method of the invention characteristically has a pull down rate controller 13 for changing a pull down rate of the ingot 3 in response to a casting stroke. The pull down rate controller 13 comprises a casting stroke counter 14, a motor drive amount computing unit 15 and a shaft-pull-down motor 16.

The casting stroke counter 14 measures a casting stroke and then outputs a signal of the measured casting stroke to the motor drive amount computing unit 15. The motor drive amount computing unit 15 computes a drive amount of the shaft-pull-down motor 16 from an input of the measured casting stroke according to the predetermined deceleration rate (amount of reduction of pull down rate), and outputs a computation result to the shaft-pull-down motor. The shaft-pull-down motor 16 is driven based on a signal input therefrom.

According to the electromagnetic casting apparatus of the invention, an electromagnetic casting method of the invention can easily be applied, and thus the region of precipitation of foreign substances in a finally solidified portion of ingot can be reduced and cracking generation can be prevented.

Examples

By using an apparatus having a configuration described in FIG. 1 above, and applying an electromagnetic casting method of the invention, a silicon ingot (sectional shape: 345 mm×512 mm, length: 6,900 mm) was cast to examine the region of precipitation of foreign substances and the absence or presence of cracking generation in the finally solidified portion of ingot. For comparison, a similar examination was also performed in a case of applying a conventional casting method in which a pull down rate was not reduced.

As described below, casting conditions were the same as those illustrated in FIGS. 3A and 3B above.

Condition 1: Decelerate at a rate of 0.05 mm/min per hour from a casting stroke of 5,222.0 mm
Condition 2: Decelerate at a rate of 0.2 mm/min per hour from a casting stroke of 6,450.5 mm
Conventional method: Decelerate immediately to 0 mm/min at a casting stroke of 6,860 mm Methods for measuring and evaluating the region of precipitation of foreign substances and the absence or presence of cracking generation in the finally solidified portion of ingot are as follows. Specific techniques will be described with reference to FIGS. 4A and 4B.

[Region of Precipitation of Foreign Substances]

Evaluated by a depth (mm) below a top-side (a finally solidified portion side) end surface of ingot down to an end of a portion where the precipitation of foreign substances was observed.

[Absence or Presence of Cracking Generation]

Evaluated by visually examining the absence or presence of fragments of peel-off on a top-side of ingot.

Figure 4A:
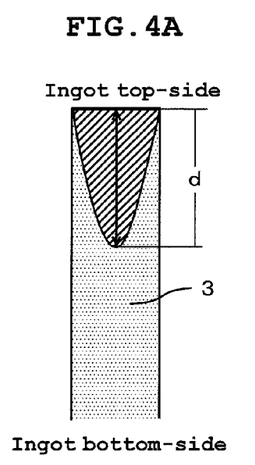
Figure 4B:
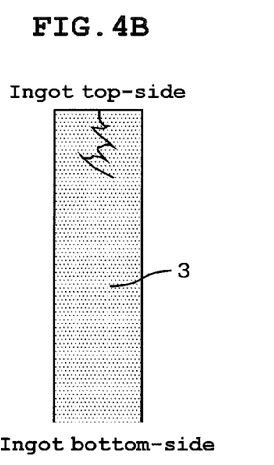

FIGS. 4A and 4B are views for describing a method for measuring and evaluating a precipitation range of foreign substances and a presence of cracking generation in the finally solidified portion of ingot, of these, FIG. 4A shows the region of precipitation of foreign substances and FIG. 4B shows a state of cracking generation.

As shown in FIG. 4A, after a sample ingot was cut from the top-side of ingot so as to include a portion where the precipitation of foreign substances is observed, the sample ingot was cut along its center axis to visualize the precipitated foreign substances by etching a cut surface with acid. A shaded area in FIG. 4A indicates the region of precipitation of foreign substances, and the region of precipitation (precipitation depth) of foreign substances can be determined by measuring a depth d (mm) below the top-side end surface of ingot. Meanwhile, it is understood that the precipitated foreign substances are normally distributed entirely inside the solid-liquid interface (that is, inside the liquid molten silicon) just before shifting to the final solidification process. Therefore, the shaded area in FIG. 4A corresponds to a portion which was not solidified just before shifting to the final solidification process, the region of precipitation (precipitation depth) of foreign substances corresponds to a depth of solid-liquid interface at that time point.

As shown in FIG. 4B, cracking caused by the confinement of molten silicon is discerned in the vicinity of the top-side end surface of ingot, where the ingot is cracked to exfoliate fragments thereof. Therefore, when a 10 kg or more of fragments is exfoliated, it is determined that cracking due to the confinement of molten silicon is generated.

Figure 5:
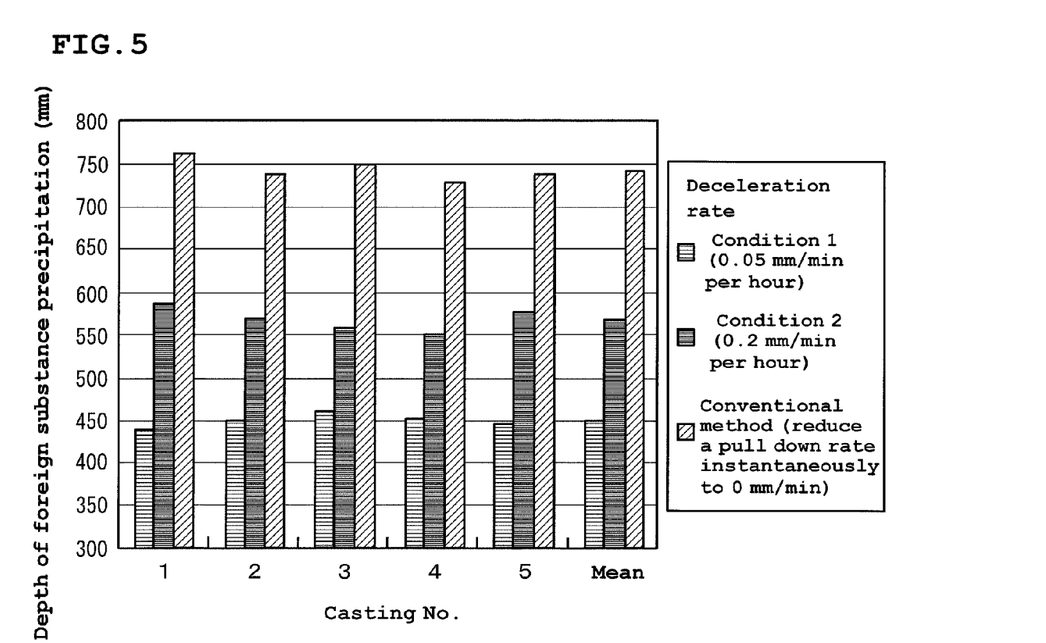
FIG. 5 is a diagram showing results of EXAMPLES indicating the depth of foreign substance precipitation both in each casting condition and in each examination conducted for several times.

Examination results concerning the region of precipitation of foreign substances are shown in Table 1 and FIG. 5.

TABLE 1

| Casting No. | | 1 | 2 | 3 | 4 | 5 | (Scale: mm) Mean |
|---|---|---|---|---|---|---|---|
| Inventive Example | Condition 1 (decelerate by 0.05 mm/min per hour) | 440 | 450 | 460 | 450 | 445 | 449 |
| | Condition 2 (decelerate by 0.2 mm/min per hour) | 590 | 570 | 560 | 550 | 580 | 570 |
| Conventional method (reduce a pull down rate instantaneously to 0 mm/min) | | 765 | 740 | 750 | 730 | 740 | 745 |

FIG. 5 is a diagram showing results of Table 1 indicating a depth of foreign substance precipitation both in each casting condition and in each casting conducted for several times.

As shown in Table 1 and FIG. 5, when an examination was performed by applying a conventional casting method, Comparative Example, in which a pull down rate was not reduced, the region of precipitation (precipitation depth) of foreign substances was 745 mm as the mean of five examinations. Contrary to this, when the electromagnetic casting method of the invention (Condition 1, Condition 2) is applied, the depth of foreign substance precipitation was further decreased and in Condition 1 in which a pull down rate was slowly reduced (decelerated at 0.05 mm/min per hour), the extent of decrease of depth was further improved.

An examination result of cracking generation is shown in Table 2.

TABLE 2

| | Casting No. | 1 | 2 | 3 | 4 | 5 |
|---|---|---|---|---|---|---|
| Inventive Example | Condition 1 (decelerated by 0.05 mm/min per hour) | Not found | Not found | Not found | Not found | Not found |
| | Condition 2 (decelerated by 0.2 mm/min per hour) | Not found | Not found | Not found | Not found | Not found |
| Conventional method (reduce a pull down rate instantaneously to 0 mm/min) | | Not found | Not found | Found | Not found | Found |

As shown in Table 2, when an examination was performed by applying a conventional casting method, cracking generation was found in two of five casting examinations, however when the electromagnetic casting method of the invention was applied, no cracking generation was observed.

According to the electromagnetic casting method of polycrystalline silicon and the electromagnetic casting apparatus of the invention, the range of precipitation of foreign substances in the finally solidified portion of an ingot and the region of generation of crystal defects caused therefrom can be reduced and cracking generation can be prevented so as to improve a production yield of the ingot. Therefore, the present invention can be effectively utilized in the field of production of a solar cell.

What is claimed is:

1. An electromagnetic casting method of polycrystalline silicon for continuously casting polycrystalline silicon, the method comprising:
    charging silicon raw materials into a bottomless cold mold;
    melting the silicon raw materials using electromagnetic induction heating; and
    pulling down the molten silicon to solidify it,
    wherein the depth of solid-liquid interface from an upper surface of the molten silicon before the startup of a final solidification process is reduced by reducing a pull down rate of ingot from a prescribed rate in a final phase of a steady-state casting,
    wherein the prescribed rate is such that molten silicon on the solidified silicon is confined in the solidified silicon when the silicon ingot is pulled at the prescribed rate in the final solidification process, and
    wherein the reduced pull down rate from the prescribed rate is such that molten silicon on the solidified silicon is not confined in the solidified silicon when the silicon ingot is pulled at the reduced rate in the final solidification process.

2. The electromagnetic casting method of polycrystalline silicon according to claim 1, wherein the pull down rate ingot is reduced by 0.05 to 0.2 mm/min per hour.

3. An electromagnetic casting apparatus for polycrystalline silicon including: a conductive bottomless cold mold in which a part of the mold along an axial direction is divided into a plurality of elements in a circumferential direction; an induction coil surrounding t he mold; and a heat retention heater arranged below the mold for slowly cooling a solidified silicon ingot, in which silicon melted by electromagnetic induction heating using the induction coil is pulled down and solidified, the apparatus comprising:
    a pull down rate controller for changing a pull down rate of ingot between a prescribed rate and a reduced rate from the prescribed rate in response to a casting stroke,
    wherein the pull down rate controller comprises:
    a casting stroke counter for measuring the casting stroke;
    a motor drive amount computing unit for computing a drive amount of a shaft-pull-down motor according to a predetermined deceleration rate by inputting the measured casting stroke and then outputting the computation result to the shaft-pull-down motor; and
    a shaft-pull-down motor that is driven based on a signal input from the motor drive amount computing unit,
    wherein the prescribed rate is such that molten silicon is confined in the solidified silicon when the silicon ingot is culled at the prescribed rate in the final solidification process, and
    wherein the reduced rate from the prescribed rate is such that molten silicon is not confined in the solidified silicon when the silicon ingot is pulled at the reduced rate in the final solidification process.

* * * * *

UNITED STATES PATENT AND TRADEMARK OFFICE
CERTIFICATE OF CORRECTION

| | | |
|---|---|---|
| PATENT NO. | : 9,553,221 B2 | Page 1 of 1 |
| APPLICATION NO. | : 13/845507 | |
| DATED | : January 24, 2017 | |
| INVENTOR(S) | : Maegawa et al. | |

It is certified that error appears in the above-identified patent and that said Letters Patent is hereby corrected as shown below:

On the Title Page

Priority was NOT claimed of JP 2011-029115 (Feb. 14, 2011). This application should not be listed under Foreign Application Priority Data.

In the Claims

Column 12, Line 17:
"silicon according to claim 1, wherein the pull down rate"
Should read:
"silicon according to claim 1, wherein the pull down rate of"

Column 12, Line 23:
"induction coil surrounding t he mold; and a heat retention"
Should read:
"induction coil surrounding the mold; and a heat retention"

Column 12, Line 42:
"is culled at the prescribed rate in the final solidification"
Should read:
"is pulled at the prescribed rate in the final solidification"

Signed and Sealed this
First Day of August, 2017

Joseph Matal
*Performing the Functions and Duties of the*
*Under Secretary of Commerce for Intellectual Property and*
*Director of the United States Patent and Trademark Office*